United States Patent
Yu et al.

(10) Patent No.: US 12,169,315 B2
(45) Date of Patent: Dec. 17, 2024

(54) OPTOELECTRONIC MODULES AND WAFER-LEVEL METHODS FOR MANUFACTURING THE SAME

(71) Applicant: ams Sensors Singapore Pte. Ltd., Singapore (SG)

(72) Inventors: Qi Chuan Yu, AE Eindhoven (NL); Hartmut Rudmann, AE Eindhoven (NL); Ji Wang, AE Eindhoven (NL); Kam Wah Leong, AE Eindhoven (NL); Kim Lung Ng, AE Eindhoven (NL)

(73) Assignee: ams Sensors Singapore Pte. Ltd., Singapore (SG)

( * ) Notice: Subject to any disclaimer, the term of this patent is extended or adjusted under 35 U.S.C. 154(b) by 415 days.

(21) Appl. No.: 16/978,736

(22) PCT Filed: Feb. 27, 2019

(86) PCT No.: PCT/SG2019/050107
§ 371 (c)(1),
(2) Date: Sep. 7, 2020

(87) PCT Pub. No.: WO2019/172841
PCT Pub. Date: Sep. 12, 2019

(65) Prior Publication Data
US 2021/0041650 A1 Feb. 11, 2021

Related U.S. Application Data
(60) Provisional application No. 62/639,700, filed on Mar. 7, 2018.

(51) Int. Cl.
*G02B 6/36* (2006.01)
*G02B 6/42* (2006.01)
(Continued)

(52) U.S. Cl.
CPC ......... *G02B 6/4292* (2013.01); *G02B 6/4249* (2013.01); *H01L 27/14618* (2013.01); *H01L 31/02327* (2013.01); *H01L 33/56* (2013.01)

(58) Field of Classification Search
CPC ...... G02B 6/4292; G02B 6/4249; G02B 6/36; H01L 27/14618; H01L 31/02327;
(Continued)

(56) References Cited

U.S. PATENT DOCUMENTS 6,221,687 B1 * 4/2001 Abramovich ..... H01L 27/14627
438/69
10,551,596 B2 * 2/2020 Wu ......................... H01L 33/58
(Continued)

FOREIGN PATENT DOCUMENTS

CN 105531829 A 4/2016
CN 108076671 A 5/2018
(Continued)

OTHER PUBLICATIONS
PCT/SG2019/050107 International Search Report and Written Opinion, mailed May 29, 2019; 10 pages.
(Continued)

*Primary Examiner* — Jennifer Doan
(74) *Attorney, Agent, or Firm* — VIERING, JENTSCHURA & PARTNER mbB

(57) ABSTRACT

An apparatus includes an optoelectronic component mounted to a PCB substrate. A transmissive adhesive is disposed directly on the optoelectronic component and is transmissive to light of a wavelength sensed by, or emitted by, the optoelectronic component. The apparatus includes an optical filter disposed directly on the transmissive adhesive. An epoxy laterally surrounds and is in contact with side surfaces of the transmissive adhesive and the optical filter. The epoxy is non-transmissive to light of a wavelength
(Continued)

sensed by, or emitted by, the optoelectronic component. In some cases, the epoxy defines a recess directly over the optical filter to accommodate an optical component, such as an optical diffuser. Methods of fabricating the modules are disclosed as well.

15 Claims, 5 Drawing Sheets

(51) Int. Cl.
*H01L 27/146* (2006.01)
*H01L 31/0232* (2014.01)
*H01L 33/56* (2010.01)

(58) Field of Classification Search
CPC ... H01L 33/56; H01L 33/54; H01L 2933/005; H01L 31/0203; H01L 27/14683
USPC .......................................................... 385/88
See application file for complete search history.

(56) References Cited

U.S. PATENT DOCUMENTS

| | | | | |
|---|---|---|---|---|
| 2006/0023108 A1* | 2/2006 | Watanabe | ......... | H01L 27/14627 348/335 |
| 2007/0126914 A1* | 6/2007 | Komatsu | ........... | H01L 27/14618 348/340 |
| 2010/0164032 A1* | 7/2010 | Kita | ................... | H01L 27/14683 257/E31.127 |
| 2010/0176476 A1 | 7/2010 | Takayama et al. | | |
| 2018/0003927 A1 | 1/2018 | Wu et al. | | |
| 2018/0006192 A1 | 1/2018 | Rudmann et al. | | |
| 2018/0239116 A1 | 8/2018 | Yu et al. | | |
| 2020/0127156 A1* | 4/2020 | Camarri | ............ | H01L 31/02325 |
| 2022/0028908 A1 | 1/2022 | Gubser et al. | | |

FOREIGN PATENT DOCUMENTS

| | | |
|---|---|---|
| KR | 20170129555 A | 11/2017 |
| WO | 2016013977 A1 | 1/2016 |
| WO | 2017176213 A1 | 10/2017 |

OTHER PUBLICATIONS

Chinese office action issued for the corresponding Chinese patent application No. 201980031222.0, dated Dec. 29, 2023, 8 pages (for informational purposes only).

Gad-El-Hak, M.; "MEMS Design and Fabrication"; The MEMS Handbook; dated Feb. 28, 2010; 15 pages machine translation + 11 pages original language.

Office Action for corresponding CN Application No. 201980031222.0; dated Jul. 9, 2024; 9 pages (for reference purpose only).

* cited by examiner

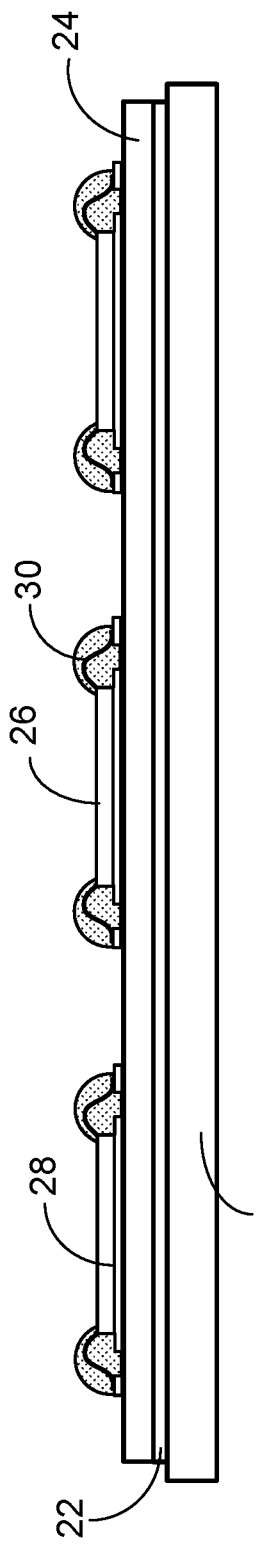
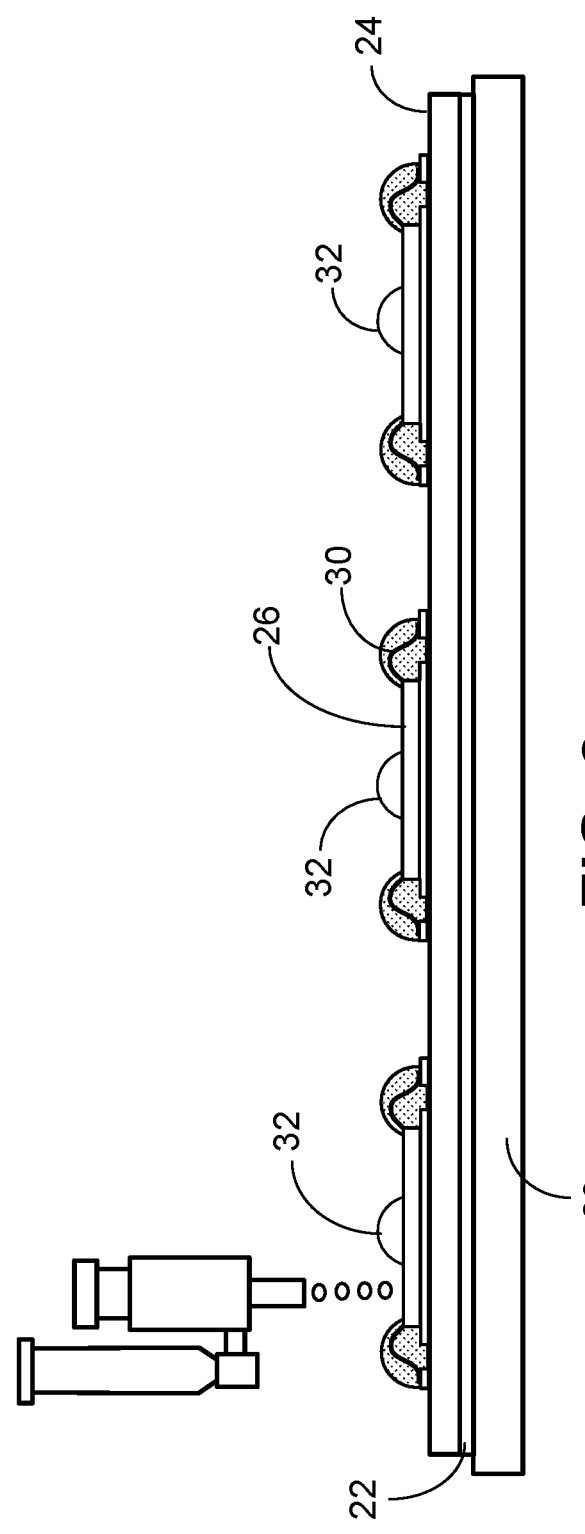

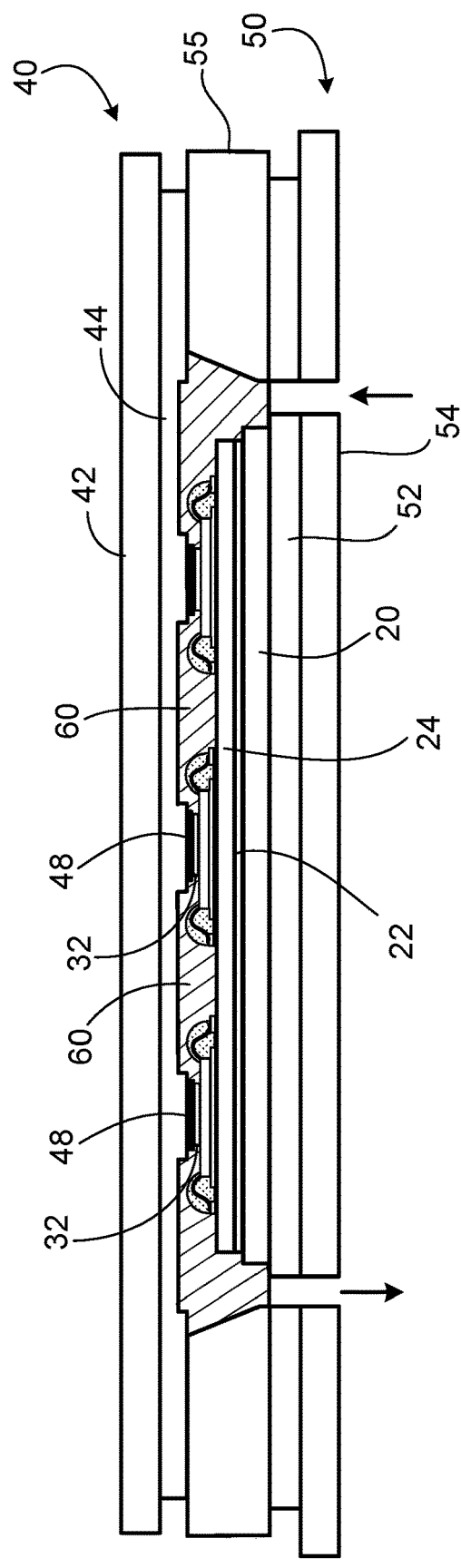
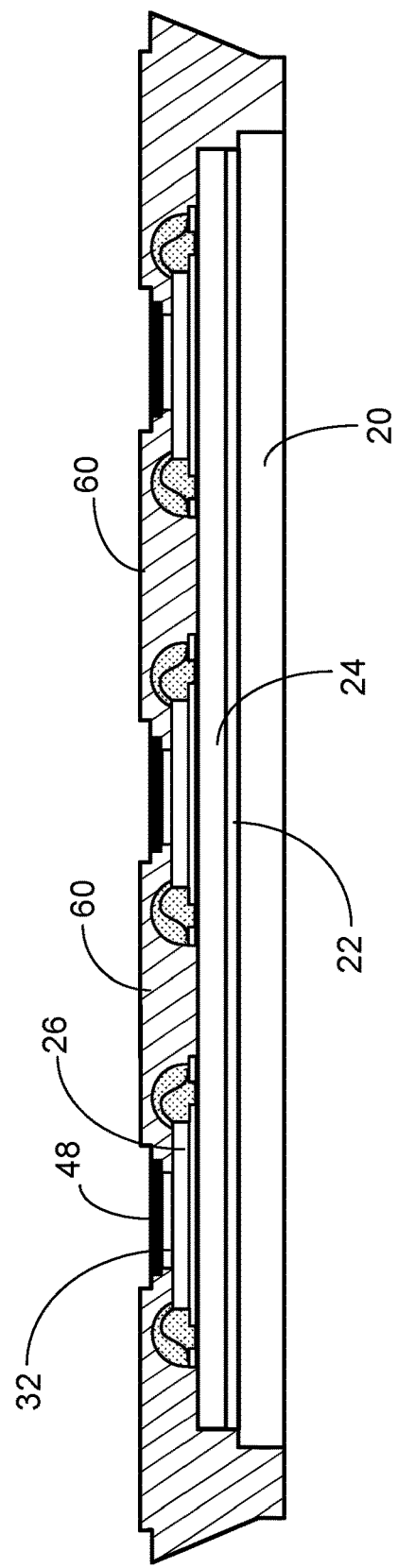
FIG. 7
FIG. 8

OPTOELECTRONIC MODULES AND WAFER-LEVEL METHODS FOR MANUFACTURING THE SAME

CROSS-REFERENCE TO RELATED APPLICATIONS

This application is a 371 U.S. National Phase of PCT International Patent Application No. PCT/SG2019/050107, filed on Feb. 27, 2019, which claims benefit and priority to U.S. provisional patent application No. 62/639,700, filed on Mar. 7, 2018, the disclosures of which are each incorporated by reference herein in their entirety.

FIELD OF THE DISCLOSURE

This disclosure relates to optoelectronic modules and wafer-level methods for manufacturing the modules.

BACKGROUND

Various consumer electronic products such as smart phones and other host computing devices include compact optoelectronic modules that have integrated light sensing or light emitting devices. In some instances, space is at a premium in the host devices. Thus, it is desirable to make the modules as small and compact as possible. As a result of manufacturing and other tolerances, the dimensions (e.g., height) of the modules tends to vary. It is, however, desirable to obtain greater uniformity for the modules.

SUMMARY

The present disclosure describes optoelectronic modules and methods of manufacturing such modules in a wafer-level process.

For example, in one aspect, the disclosure describes an apparatus including an optoelectronic component mounted to a PCB substrate. A transmissive adhesive is disposed directly on the optoelectronic component and is transmissive to light of a wavelength sensed by, or emitted by, the optoelectronic component. The apparatus includes an optical filter disposed directly on the transmissive adhesive, and an epoxy laterally surrounding and in contact with side surfaces of the transmissive adhesive and the optical filter. The epoxy is non-transmissive to light of a wavelength sensed by, or emitted by, the optoelectronic component.

Some implementations include one or more of the following features. For example, the epoxy can define a recess directly over the optical filter to accommodate an optical component (e.g., an optical diffuser). Preferably, there is no air gap between the optoelectronic component and the optical filter because of the presence of the transmissive adhesive. The epoxy can be, for example, a black epoxy.

In some instances, the optoelectronic component is operable to emit light. In other instances, the optoelectronic component is operable to sense light. In either case, the transmissive adhesive and the optical filter can be disposed so as to intersect an optical axis of the optoelectronic component.

Modules as described in this disclosure can be integrated into a host device such as a smart phone or other portable computing device. Thus, in another aspect, the present disclosure describes an apparatus including a host device that includes a processor and a display screen, as well as an optoelectronic module. The optoelectronic module can include features as set forth above and/or as described in greater detail below. The processor is operable to control a feature of the host device based, at least in part, on signals from the optoelectronic component.

In another aspect, the present disclosure describes a method of manufacturing optoelectronic modules. The method includes holding a PCB wafer in a first vacuum injection molding tool, wherein multiple optoelectronic components are mounted on the PCB wafer, each of the optoelectronic components having a respective amount of unhardened transmissive adhesive on its surface intersecting an optical axis of the optoelectronic component, wherein the adhesive is transmissive to light of a wavelength sensed by, or emitted by, the optoelectronic component. The method further includes providing a second vacuum injection molding tool including an elastomeric layer having a structured surface on which are mounted multiple optical filters. The first and second vacuum injection molding tools are brought toward one another so as to press the optical filters into contact with the unhardened transmissive adhesive. Subsequently, the transmissive adhesive is hardened. The method includes injecting an epoxy into spaces between the elastomeric layer of the second vacuum injection molding tool and the PCB wafer such that the epoxy laterally surrounds and is in contact with side surfaces of the transmissive adhesive and the optical filters, wherein the epoxy is non-transmissive to light of a wavelength sensed by, or emitted by, the optoelectronic components. The epoxy is hardened. The method includes cutting through the black epoxy to form singulated modules each of which includes at least one of the optoelectronic components.

Some implementations include one or more of the following features. For example, the method can include selectively dispensing the unhardened transmissive adhesive onto the surface of each respective optoelectronic component such that the adhesive intersects the optical axis of the optoelectronic component. In some instances, a seal plate is disposed on the elastomeric layer and defines a precise height that separates the first and second vacuum injection molding tools when they are brought together to press the optical filters into contact with the unhardened transmissive adhesive.

Various advantages can be obtained in some implementations. For example, in some cases, the manufacturing process can result in greater uniformity among the modules (e.g., greater uniformity in their thickness).

Other aspects, features and advantages will be readily apparent from the following detailed description, the accompanying drawings, and the claims.

BRIEF DESCRIPTION OF THE DRAWINGS

FIGS. 1-8 illustrate steps in a method of manufacturing optoelectronic modules.

DETAILED DESCRIPTION

Figure 3:
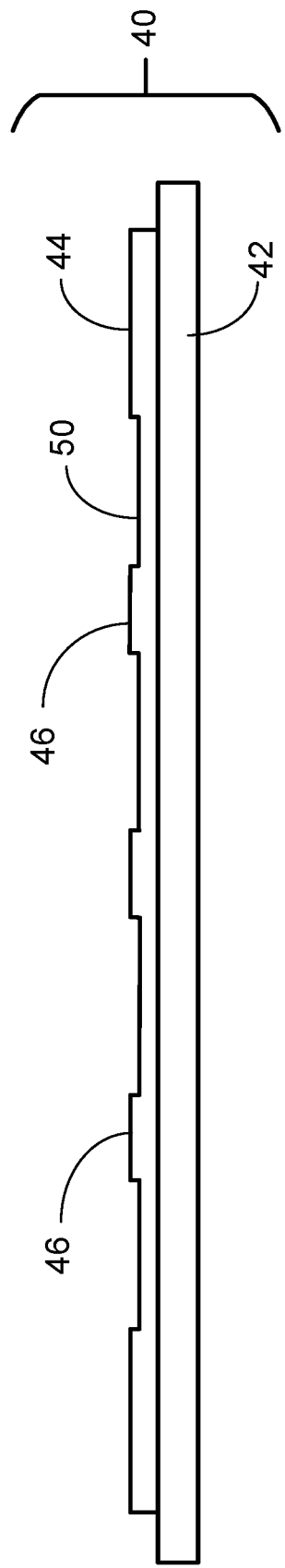

The present disclosure describes wafer-level manufacturing techniques for fabricating multiple optoelectronic modules in parallel at the same time. Each module includes an optoelectronic component such a light emitting die or light receiver die (e.g., an integrated circuit semiconductor chip). Examples of light emitting components include light emitting diodes (LEDs), infra-red (IR) LEDs, organic LEDs (OLEDs), infra-red (IR) laser diodes, vertical cavity surface emitting lasers (VCSELs)) and arrays of such devices. Examples of light receiver components include image sensors, photodiodes and arrays of such devices. Associated processing circuitry can be implemented, for example, in the same integrated circuit semiconductor chip that may include appropriate logic and/or other hardware components (e.g., read-out registers; amplifiers; analog-to-digital converters; clock drivers; timing logic; signal processing circuitry; and/or microprocessor).

Each module also includes an optical filter disposed directly over the optoelectronic component and that intersects the optoelectronic component's optical axis. To accommodate slight differences in thickness among the various optoelectronic components during the manufacturing process, a transparent adhesive is provided between each optical filter and the upper surface of the associated optoelectronic component. Use of the transparent adhesive in the manufacturing process can result in greater uniformity among the modules (e.g., greater uniformity in their thickness).

The following paragraphs describe an example of the wafer-level process.

As shown in FIG. 1, multiple optoelectronic component 26 are mounted to a printed circuit board (PCB) wafer 24 by way of respective die pads 28. Bond wires 30 can provide electrical connections from conductive pads on the optoelectronic components 26 to conductive pads on the PCB wafer 24. The bond wires 30 can be encapsulated, for example, by a protective adhesive or epoxy. The PCB wafer 24 is attached by way of double-sided adhesive tape 22 to a transparent rigid carrier 20 that is composed, for example, of glass.

Next, as indicated by FIG. 2, a small amount of a transparent adhesive material 32 is dispensed onto the top surface of each optoelectronic component 26. The adhesive material 32 can be, for example, an epoxy that is transmissive for the wavelength(s) of light (e.g., visible or infra-red) emitted by or detectable by the optoelectronic components 26. In some instances, the transparent adhesive 32 has a relatively high viscosity. Further, the transparent adhesive 32 can have a relatively small coefficient of thermal expansion (CTE). In particular, in some instances, the CTE of the transparent adhesive 32 is the same as, or very close to, the CTE of the light sensitive or light emitting component (e.g., close enough to prevent cracking, fracture, delamination or other mechanical defects while manufacturing the optoelectronic).

As illustrated in FIG. 3, an upper vacuum injection molding (VIM) tool 40, which also may be referred to as a baffle tool, includes a structured elastomeric layer 44 on a rigid substrate 42. The rigid substrate 42 can be composed, for example, of glass. The elastomeric layer 44 can be composed, for example, of polydimethylsiloxane (PDMS) and includes projections 46 that extend slightly beyond the main surface 50 of the elastomeric layer 44. Each projection 46 preferably has a width (i.e., in the x-y directions parallel to the plane of the PCB wafer 24) slightly larger than the width of the optical filters 48.

Figure 4:
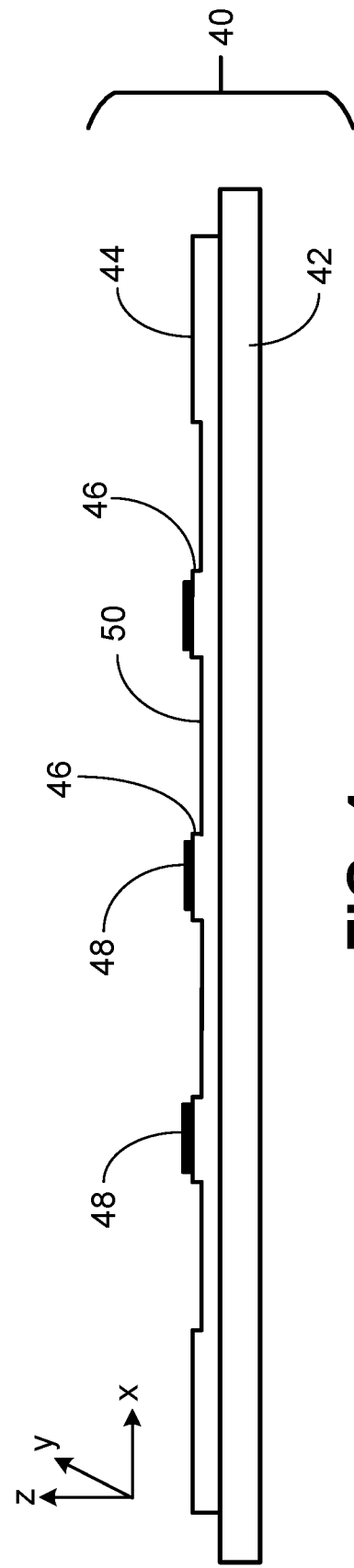

Next, as shown in FIG. 4, a respective optical filter 48 is placed on each of the projections 46 of the PDMS layer 44. The filters 48 may be placed, for example, by pick-and-place equipment. In some cases, a radiochromic film (RCF) may be provided as the filters 48.

Figure 5:
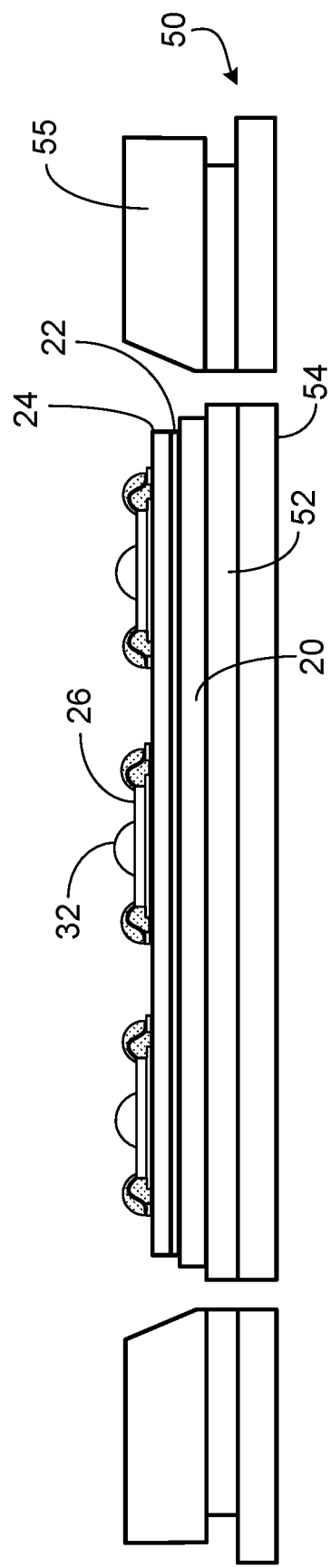
Figure 6:
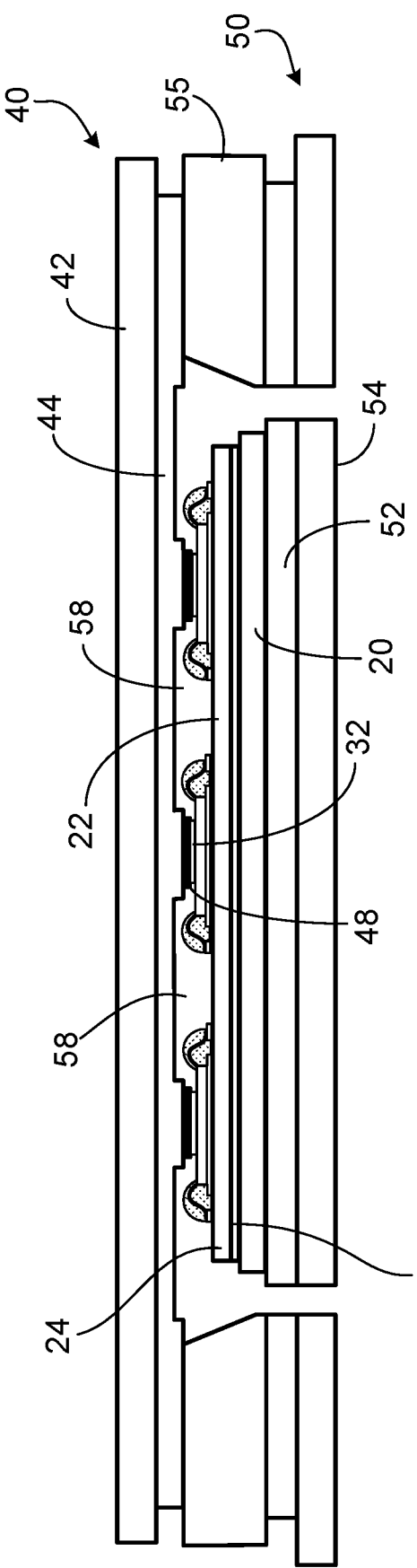

As shown in FIG. 5, the transparent rigid carrier 20 on which the PCB wafer 24 is mounted is placed onto a lower VIM tool 50, which also may be referred to as a substrate tool. The substrate tool 50 includes an elastomeric (e.g., PDMS) layer 52 on a rigid substrate 54 composed, for example, of glass. A seal plate 55 having a large central opening is disposed on the elastomeric layer 52 near its periphery and defines a precise height that separates the upper and lower VIM tools 40, 50 when they are brought together as shown in FIG. 6.

When the upper and lower VIM tools 40, 50 are brought together, the optical filters 48 press against corresponding ones of the regions of transparent adhesive 32 previously deposited on the optoelectronic components 26, thereby flattening the adhesive 32. The transparent adhesive 32 then can be hardened, for example, by UV or thermal curing. Spaces 58 remain between the elastomeric layer 44 of the upper tool 40 and the PCB wafer 24. In a subsequent step, these spaces 58 are filled with a black epoxy.

Because the seal plate 55 fixes the distance between the upper and lower VIM tools 40, 50, and because the rigid substrate 54 helps prevent the PCB wafer 24 from bending, the overall height from the bottom of a particular optoelectronic component 26 to the top of the adhesive material 48 is substantially uniform from component-to-component. In this manner, the transparent adhesive 32 helps accommodate variations in the thickness of the light sensitive or light emitting components 26.

Next, while the upper and lower tools 40, 50 remain in place, a black epoxy 60 is injected into by a VIM process and fills the spaces 58, as shown in FIG. 7. The black epoxy 60 then can be hardened, for example, by UV and/or thermal curing. This can be accomplished, in some instances, while the upper and lower tools 40, 50 remains in place. The black epoxy 60 thus encapsulates the optoelectronic components 26 and laterally surrounds the transparent adhesive 32 and the optical filters 48. As shown by FIG. 7, the black epoxy 60 is in contact with the side surfaces of the adhesive 32 and filters 48. Although the injected epoxy 60 may be referred to as black epoxy, more generally the epoxy 60 should be non-transmissive to light of a wavelength sensed by, or emitted by, the optoelectronic devices 26 mounted on the PCB wafer 24. After the epoxy material 60 is hardened, the VIM tools 40, 50 are removed (see FIG. 8).

In some instances, narrow vertical trenches are formed through the black epoxy 60. The trenches preferably extend partially into the PCB wafer 24 and serve to release stress. The trenches can be formed, for example, by dicing, and separate adjacent ones of the optoelectronic components 26 from one another. In some cases, additional, larger trenches can be formed closer to the edge of the PCB wafer 24 and can help during the subsequent release of the of the PCB wafer 24 from the tape 22. In some cases, an intermediate carrier is attached to the top of the assembly (i.e., on the outer surface of the black epoxy 60 while heat is applied to remove the double-sided tape 22 as well as the rigid carrier 20.

The partially separated modules then can be separated completely from one another during a final singulation process (e.g., dicing). The result is multiple singulated modules 100 (see FIG. 9) each of which includes an optoelectronic component 26 mounted on a PCB substrate 104 by way of a die pad 106, an optical filter 48 disposed directly over the optoelectronic component, and a transparent adhesive 32 between the optical filter and the upper surface of the optoelectronic component. The transparent adhesive 32 is in contact with the upper surface of the optoelectronic component 26 as well as the lower surface of the optical filter 48. Thus, there is no air gap between the optoelectronic component 26 and the optical filter 48. As mentioned above, the process described above can result in less variation in the module height, and thus greater uniformity among the modules.

Figure 9:
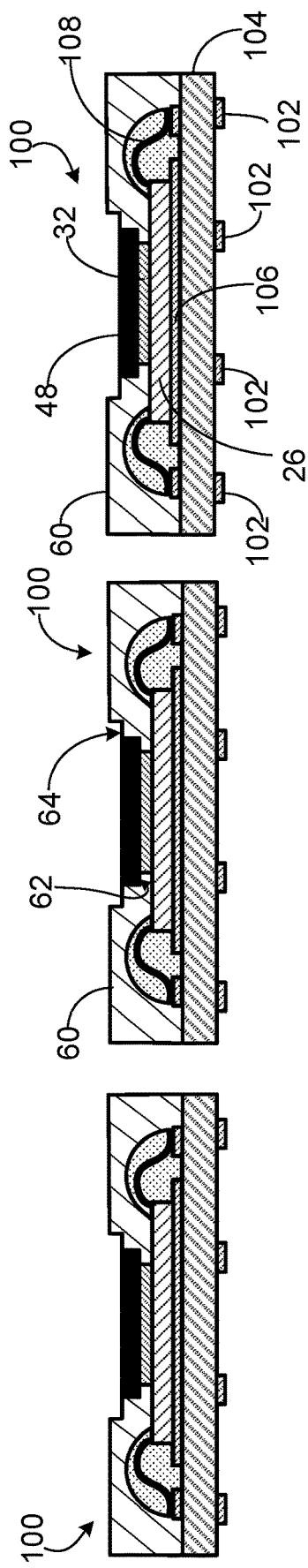
FIG. 9 illustrates examples of the optoelectronic modules.

As can be seen from FIG. 9, the black epoxy 60 encapsulates the optoelectronic component 26 and laterally surrounds the transparent adhesive 32 and the optical filter 48. The black epoxy 60 also defines multiple recesses: a first recess 62 accommodates the optical filter 48, and a second recess 64 can accommodate another optical component (e.g., an optical diffuser, or a lens, etc.). The VIM process described above allows both recesses to be formed at the same time. As shown in FIG. 9, the width of the second recess 64 can be slightly larger than the width of the optical filter 48.

The module 100 also can include bond wires 108 that provide electrical connection between bond pads on the top of the optoelectronic component 26 and additional bond pads on the PCB substrate 104. In some cases, the bond wires 108 may be encapsulated by an epoxy prior to performing the VIM process described above.

The modules 100 described here can be integrated into a wide range of portable computing devices, such as smart phones, wearables, bio devices, mobile robots, surveillance cameras, camcorders, laptop computers, and tablet computers, among others. The module 100 can include SMT or other pads 102 on its backside to allow the module to be mounted, for example, to a PCB flex cable in a host device. The modules can be useful, for example, as optical sensing modules, such as for gesture sensing or recognition.

The design of smart phones and other portable computing devices referenced in this disclosure can include one or more processors, one or more memories (e.g. RAM), storage (e.g., a disk or flash memory), a user interface (which may include, e.g., a keypad, a TFT LCD or OLED display screen, touch or other gesture sensors, a camera or other optical sensor, a compass sensor, a 3D magnetometer, a 3-axis accelerometer, a 3-axis gyroscope, one or more microphones, etc., together with software instructions for providing a graphical user interface), interconnections between these elements (e.g., buses), and an interface for communicating with other devices (which may be wireless, such as GSM, 3G, 4G, CDMA, WiFi, WiMax, Zigbee or Bluetooth, and/or wired, such as through an Ethernet local area network, a T-1 internet connection). In some instances, the one or more processors use signals from the module (e.g., signals from the receiver die 24) to adjust a brightness of the host device's display screen.

Various modifications will be readily apparent and can be made to the foregoing examples. Features described in connection with different embodiments may be incorporated into the same implementation in some cases, and various features described in connection with the foregoing examples may be omitted from some implementations. Thus, other implementations are within the scope of the claims.

What is claimed is:

1. An apparatus comprising:
   an optoelectronic component mounted to a PCB substrate;
   a transmissive adhesive disposed directly on the optoelectronic component, wherein the adhesive is transmissive to light of a wavelength sensed by, or emitted by, the optoelectronic component;
   an optical filter disposed directly on and in contact with the transmissive adhesive; and
   an epoxy laterally surrounding and in contact with side surfaces of the transmissive adhesive and the optical filter, wherein the epoxy is non-transmissive to light of a wavelength sensed by, or emitted by, the optoelectronic component; and
   wherein a coefficient of thermal expansion of the transmissive adhesive is the same as or very close to a coefficient of thermal expansion of the optoelectronic component.

2. The apparatus of claim 1 wherein the epoxy defines a recess directly over the optical filter to accommodate an optical component.

3. The apparatus of claim 1 wherein the epoxy defines a recess directly over the optical filter that accommodates an optical diffuser.

4. The apparatus of claim 1 wherein there is no air gap between the optoelectronic component and the optical filter.

5. The apparatus of claim 1 wherein the optoelectronic component is operable to emit light.

6. The apparatus of claim 1 wherein the optoelectronic component is operable to sense light.

7. The apparatus of claim 1 wherein the epoxy is a black epoxy.

8. The apparatus of claim 1 wherein the transmissive adhesive and the optical filter are disposed so as to intersect an optical axis of the optoelectronic component.

9. An apparatus comprising:
   a host device including a processor and a display screen;
   an optoelectronic module in the host device, the optoelectronic module including: an optoelectronic component mounted to a PCB substrate;
   a transmissive adhesive disposed directly on the optoelectronic component, wherein the adhesive is transmissive to light of a wavelength sensed by, or emitted by, the optoelectronic component and wherein a coefficient of thermal expansion of the transmissive adhesive is the same as or very close to a coefficient of thermal expansion of the optoelectronic component;
   an optical filter disposed directly on and in contact with the transmissive adhesive; and
   an epoxy laterally surrounding and in contact with side surfaces of the transmissive adhesive and the optical filter, wherein the epoxy is non-transmissive to light of a wavelength sensed by, or emitted by, the optoelectronic component, wherein the processor is operable to control a feature of the host device based, at least in part, on signals from the optoelectronic component.

10. The apparatus of claim 9 wherein the transmissive adhesive and the optical filter are disposed so as to intersect an optical axis of the optoelectronic component.

11. The apparatus of claim 9 wherein the epoxy defines a recess directly over the optical filter that accommodates an optical diffuser.

12. The apparatus of claim 9 wherein there is no air gap between the optoelectronic component and the optical filter.

13. The apparatus of claim 9 wherein the optoelectronic component is operable to emit light.

14. The apparatus of claim 9 wherein the optoelectronic component is operable to sense light.

15. The apparatus of claim 9 wherein the epoxy is a black epoxy.

* * * * *